United States Patent [19]

Rousselet et al.

[11] Patent Number: 5,072,196

[45] Date of Patent: Dec. 10, 1991

[54] COSTAS LOOP CARRIER RECOVERY DEVICE

[75] Inventors: Dominique Rousselet, Toulouse; Jean-Luc Foucher, Seysses; Patrick Michau, Toulouse; Pascal Triaud, Tournefeuille, all of France

[73] Assignee: Alcatel Espace, Courbevoie, France

[21] Appl. No.: 574,403

[22] Filed: Aug. 29, 1990

[30] Foreign Application Priority Data

Aug. 29, 1989 [FR] France ............... 89 11334

[51] Int. Cl.⁵ .............. H03L 7/087; H03L 7/093
[52] U.S. Cl. ........................ 331/12; 331/17; 375/120
[58] Field of Search .............. 331/11, 12, 17; 329/302, 308, 325; 375/120; 455/260

[56] References Cited

U.S. PATENT DOCUMENTS

| | | | |
|---|---|---|---|
| 3,768,030 | 10/1973 | Brown et al. | 329/325 X |
| 4,072,909 | 2/1978 | Citta | 331/12 |
| 4,336,616 | 6/1982 | Carson et al. | 455/202 |
| 4,713,630 | 12/1987 | Matthews | 331/4 |

FOREIGN PATENT DOCUMENTS

| | | |
|---|---|---|
| 0155396 | 9/1985 | European Pat. Off. . |
| 2007445 | 5/1979 | United Kingdom . |
| 2099245 | 12/1982 | United Kingdom . |

OTHER PUBLICATIONS

IEEE Transactions on Consumer Electronics, vol. CE-23, No. 3, Aug. 1977, pp. 358-365, New York, U.S.A.; R. Citta: "Frequency and Phase Lock Loop".

*Primary Examiner*—Siegried H. Grimm
*Attorney, Agent, or Firm*—Sughrue, Mion, Zinn, Macpeak & Seas

[57] ABSTRACT

A Costas loop carrier recovery device with particular application to communications with spacecraft includes a voltage-controlled oscillator. Two filters having different characteristics are connected to the oscillator by a loop filter via two circuits:
  a direct connection, and
  a parallel circuit including an amplifier in series with a filter.

5 Claims, 1 Drawing Sheet

COSTAS LOOP CARRIER RECOVERY DEVICE

BACKGROUND OF THE INVENTION

1. Field of the Invention

The invention concerns a Costas loop carrier recovery device.

2. Description of the Prior Art

A device of this kind is used in aerospace applications in a spread spectrum S band transponder for satellite orbital injection and station-keeping.

A NASA document STDN No. 203.8 entitled "Performance and design requirements specification for the second generation TDRSS user transponder" of April 1986 defines the use of a transponder of this kind whose carrier acquisition time must be less than five seconds with a probability of 90%.

The role of a Costas loop in a spread spectrum receiver is to enable coherent data demodulation and, in the case of a long loop, to offer the possibility of the transmitter being coherent with the receiver.

A loop of this kind must include a lock-on indicator and enable automatic gain control in the receiver.

The overall function to be implemented depends on constraints related to the specifications of the receiver input signal:

- input frequency (slope of the variation and maximum difference);
- minimum signal to noise density ratio;
- bit timing rate;
- demodulation losses;
- loop acquisition time.

These constraints are mutually contradictory and until now have obliged manufacturers to define ranges of operation dependent on the input signal to noise density ratio.

An object of the invention is to solve these problems.

SUMMARY OF THE INVENTION

The invention consists in a Costas loop carrier recovery device including a voltage-controlled oscillator and two filters having different characteristics connected to said oscillator by a loop filter via two circuits:

- a direct connection, and
- a parallel circuit including an amplifier in series with a filter.

The invention makes it possible to dispense with the ranges of operation previously referred to and to improve the service provided allowing for all specifications at once. What is more, the satellite tracking stations on the ground can be simplified.

The invention further enables:

- implementation of a frequency discriminator function so that the signal is acquired rapidly, even with a narrow loop bandwidth;
- implementation of a static phase error divider in the loop bandwidth to track Doppler ramps without compensation with a narrow loop and to aid fast acquisition.

The characteristics and advantages of the invention will emerge from the following description given by way of non-limiting example with reference to the appended diagrammatic drawings.

DETAILED DESCRIPTION OF THE INVENTION

Figure 1:
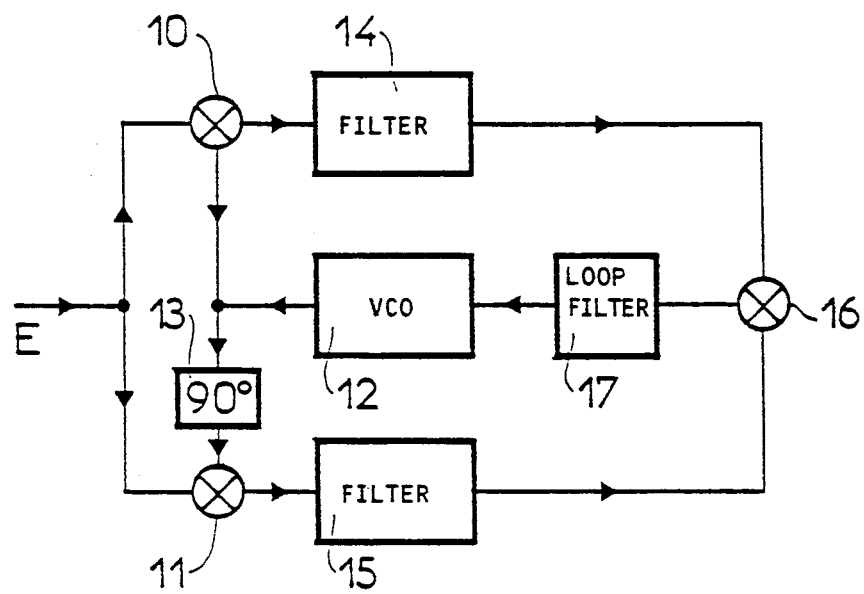
FIG. 1 shows a prior art device.

The block schematic in FIG. 1 is that of a prior art device.

The problem of carrier recovery arises in the coherent demodulation of linearly modulated signals. A Costas loop estimates the phase of the carrier: the bandwidth of the loop filter which determines the duration of the impulse response is inversely proportional to the stability of the transmitter carrier.

A loop of this kind comprises two ring modulators 10 and 11 with their inputs connected to receive the input signal E and to the output of a voltage-controlled oscillator (VCO) 12, via a 90° phase-shifter 13 in the case of one of them (11). The outputs of the two modulators are connected to respective filters 14 and 15 the outputs of which are connected to a third ring modulator 16. A loop filter 17 connects this modulator to the VCO.

The VCO 12 tracks the carrier of the input signal (E). The filters 14 and 15 have a cut-off frequency substantially equal to the bit timing rate.

The filter 17 defines the loop bandwidth and therefore the ranges of operation.

This type of solution uses a second order Costas loop whose bandwidth is switched according to the quality of the input signal.

If the signal to noise density ratio (S/No) at the receiver input increases the loop bandwidth ($\Delta f$) is increased to track faster frequency ramps without losing receiver synchronisation and with reduced demodulation losses.

On the other hand, if the signal to noise density ratio (S/No) decreases the receiver loop bandwidth ($\Delta f$) is reduced to avoid locking onto noise spikes. In this case it is necessary to limit input frequency variations or the receiver will suffer high losses and will eventually lose synchronisation. Likewise, in a conventional loop reducing the loop bandwidth increases the acquisition time.

The performance characteristics of prior art systems are as follows:

- for S/No $\geq$ 33 dBHz, $\Delta f/\Delta T \leq$ 70 Hz/s (so that the Doppler effect must be compensated on the ground);
- for S/No $\geq$ 40 dBHz, $\Delta f/\Delta T \leq$ 380 Hz/s (compensation is no longer required).

The acquisition time is better than 5 s for a maximum frequency difference of 1,400 Hz.

Figure 2:
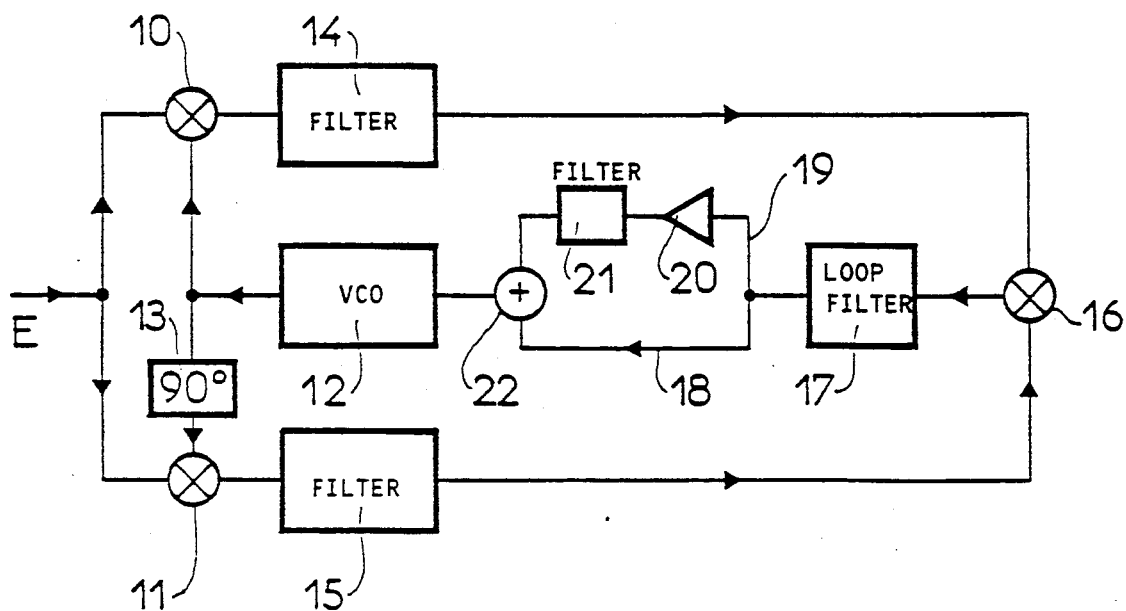
FIG. 2 shows the device in accordance with the invention.

FIG. 2 shows the device in accordance with the invention. Circuits in this figure similar to circuits shown in FIG. 1 have the same reference numbers.

The loop filter 17 is now connected to the VCO 12 through two circuits:

- a direct connection 18;
- a parallel circuit 19 incorporating an amplifier 20 in series with a filter 21.

The outputs from these two circuits are summed by an adder 22.

A device of this kind provides a low threshold (33 dBHz) and makes it possible to track faster Doppler ramps ($\geq$ 380 Hz/s) without losing receiver synchronisation and with good performance in terms of losses (these losses are related to high static phase errors due to the narrow loop $\Delta\phi = \Delta\dot{w}/w_n^2$).

Likewise, even with a narrow loop acquisition can be achieved quickly for an improved service to the user.

The loop bandwidth is chosen according to the minimum threshold. It is not changed thereafter.

For fast signal acquisition the filters 14 and 15 are made asymmetric, having different group delay times which create an error signal proportional to the initial frequency difference. The acquisition time is reduced by a factor of ten (0.5 s instead of 5 s); the filter 15 has a bandwidth at least five times wider than the filter 14.

To be able to track frequency ramps faster than the usual values (the ratio is more than 6:1) and to acquire the signal even more quickly there is added to the output of the loop filter 17 a parallel system (filter 21+amplifier 20) whose purpose is to divide static phase errors, the amplifier 20 supplying gain only at very low frequencies: for the loop to function with its bandwidth as set beforehand and for it to be stable it is imperative that this system be inoperative beyond $w_n/5$.

A system of this kind creates a second order loop whose performance characteristics are similar to those of a third order device but which remains simple to manufacture.

Its performance is as follows:

$S/No \geq 33$ dBHz, $\Delta f/\Delta T \leq 500$ Hz/s.

For $\Delta f = 1,400$ Hz the acquisition time is 0.5 s.

The angular frequency of the loop is $w_n = 100$ rad/s.

With a voltage gain of 6 it is possible to track with a narrow loop ramps six times faster than with the device shown in FIG. 1. Also, this additional gain accelerates frequency acquisition.

The device in accordance with the invention therefore has the following advantages:
- faster acquisition (0.5 s instead of 5 s) of the carrier tracking loop and therefore of the demodulation function;
- up-link carrier tracking without precompensation for the Doppler effect at the ground stations, even at the receiver threshold (the threshold for tracking without compensation is 6 dB lower than those of prior art devices).

It is understood that the present invention has been shown and described by way of preferred example only and that its component parts can be replaced by equivalent component parts without departing from the scope of the invention.

There is claimed:

1. Costas loop carrier recovery device including a voltage-controlled oscillator and two filters having different characteristics connected to said oscillator by a loop filter via two circuits:
    a direct connection, and
    a parallel circuit including an amplifier in series with a filter.

2. Device according to claim 1 wherein the bandwidth of one filter is at least five times wider than that of the other filter.

3. Device according to claim 1 wherein said amplifier in said parallel circuit has a voltage gain of 6.

4. Device according to claim 1 wherein said filter in said parallel circuit is adapted to render said parallel circuit operative only at very low frequencies.

5. Device according to claim 4 wherein said filter in said parallel circuit is adapted to render said parallel circuit operative only at frequencies below $w_n/5$ where $w_n$ is the angular frequency of the forward loop.

* * * * *